United States Patent [19]
Tobase

[11] Patent Number: 5,616,954
[45] Date of Patent: Apr. 1, 1997

[54] FLAT PACKAGE FOR SEMICONDUCTOR IC

[75] Inventor: Hiromori Tobase, Kumamoto, Japan

[73] Assignee: NEC Corporation, Tokyo, Japan

[21] Appl. No.: 515,600

[22] Filed: Aug. 16, 1995

[30] Foreign Application Priority Data

Aug. 16, 1994 [JP] Japan .................................. 6-192613

[51] Int. Cl.⁶ ........................ H01L 23/495; H01L 23/52; H01L 23/04
[52] U.S. Cl. ......................... 257/668; 257/691; 257/698; 257/703; 257/700
[58] Field of Search ................................. 257/668, 691, 257/698, 700, 703, 704

[56] References Cited

U.S. PATENT DOCUMENTS

| | | | |
|---|---|---|---|
| 4,972,253 | 11/1990 | Palino et al. | 357/74 |
| 5,168,344 | 12/1992 | Ehlert et al. | 257/704 |
| 5,315,486 | 5/1994 | Fillion et al. | 361/795 |
| 5,394,303 | 2/1995 | Yamaji | 361/749 |

FOREIGN PATENT DOCUMENTS 62-45156  2/1987  Japan .

OTHER PUBLICATIONS

LSI Handbook, Institute of Electronic and Communication Engineers of Japan, published by Ohm Sha, 1984, pp. 414–415.

*Primary Examiner*—Sara W. Crane
*Assistant Examiner*—David Ostrowski
*Attorney, Agent, or Firm*—Sughrue, Mion, Zinn, Macpeak & Seas

[57] ABSTRACT

In a flat package for a semiconductor IC (Integrated Circuit), a substrate has internal ground wirings respectively connecting a cavity and a seal metallized portion to respective suspension leads. The suspension leads are connected to ground for a shielding purpose. With this configuration, the package eliminates the need for exclusive ground leads which would limit the number of available valid leads. In addition, a single standard type of ICs can implement various shield configurations as desired by users.

7 Claims, 11 Drawing Sheets

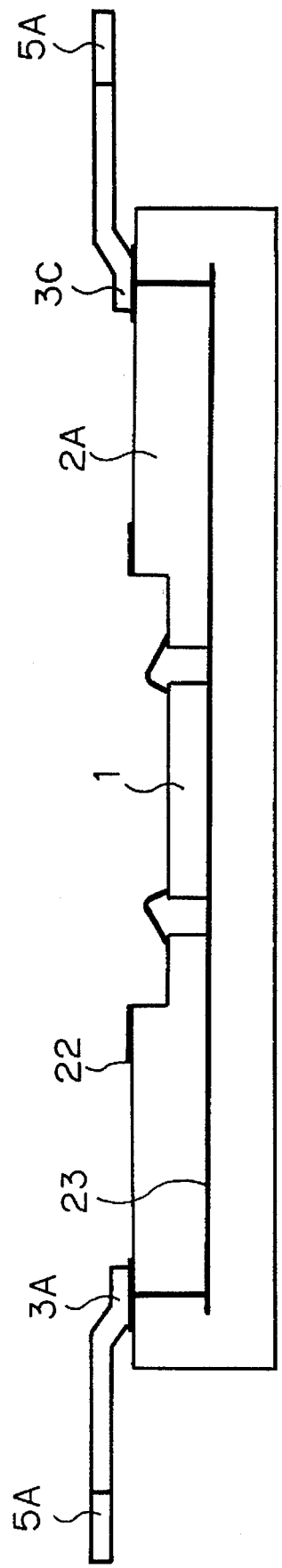
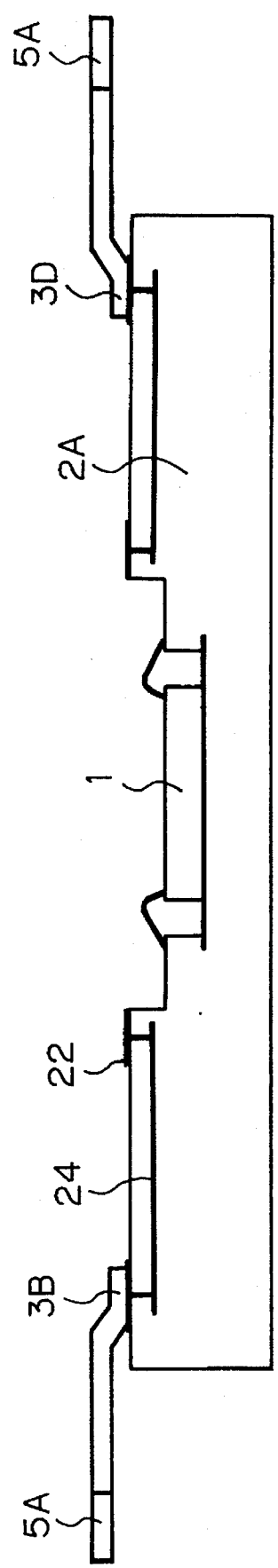

FLAT PACKAGE FOR SEMICONDUCTOR IC

BACKGROUND OF THE INVENTION

The present invention relates to a flat package for a semiconductor IC (Integrated Circuit) and, more particularly, to a quad flat package having leads extending out in four directions.

A flat package for a semiconductor IC is disclosed in, for example, "LSI Handbook" compiled by the Institute of Electronic and Communication Engineers of Japan and published by Ohm Sha, 1984, pp. 414–415. This document shows, particularly in FIG. 3.62, a typical surface mounting package having leads extending out from all the four sides thereof. This type of package is generally referred to as a quad flat package (QFP). A flat package has been developed to implement the miniaturization and advanced functions of various kinds of electronic apparatuses, and is extensively used today. A QFP in particular facilitates impedance matching because it has a substantially square contour, i.e., all the wirings in the package have substantially the same length. For this reason, QFPs are extensively applied to, for example, logical circuits needing high-speed performance. Preferably, therefore, a semiconductor chip mounted on the package should be shielded in order to be immune to external electromagnetic fields and to radiate no needless electromagnetic waves to the outside, i.e., to enhance the electromagnetic wave interference (EMI) characteristic. However, it is impossible to meet the users' different needs relating to the shield connection with a single standard type of ICs without limiting the number of valid leads.

SUMMARY OF THE INVENTION

It is, therefore, an object of the present invention to provide a flat package for a semiconductor IC and capable of meeting the users' different needs relating to shield connection with a single standard type of ICs without limiting the number of valid leads.

A flat package for a semiconductor IC of the present invention has a substrate having a metallized cavity for mounting a semiconductor chip, and a seal metallized portion for sealing a metallic cap for hermetic sealing. A lead frame has a quadrilateral frame, and four suspension leads respectively positioned at four corners of the frame for holding the substrate at the center of the frame. The substrate additionally has a first internal wiring for grounding and second internal wirings for grounding respectively connecting the cavity and the seal metallized portion to the suspension leads.

BRIEF DESCRIPTION OF THE DRAWINGS

The above and other objects, features and advantages of the present invention will become more apparent from the following detailed description taken with the accompanying drawings in which:

FIG. 3A is a section along line A–A' of FIG. 3;

FIG. 3B is a section along line B–B' of FIG. 3;

DESCRIPTION OF THE PREFERRED EMBODIMENT

Figure 1:
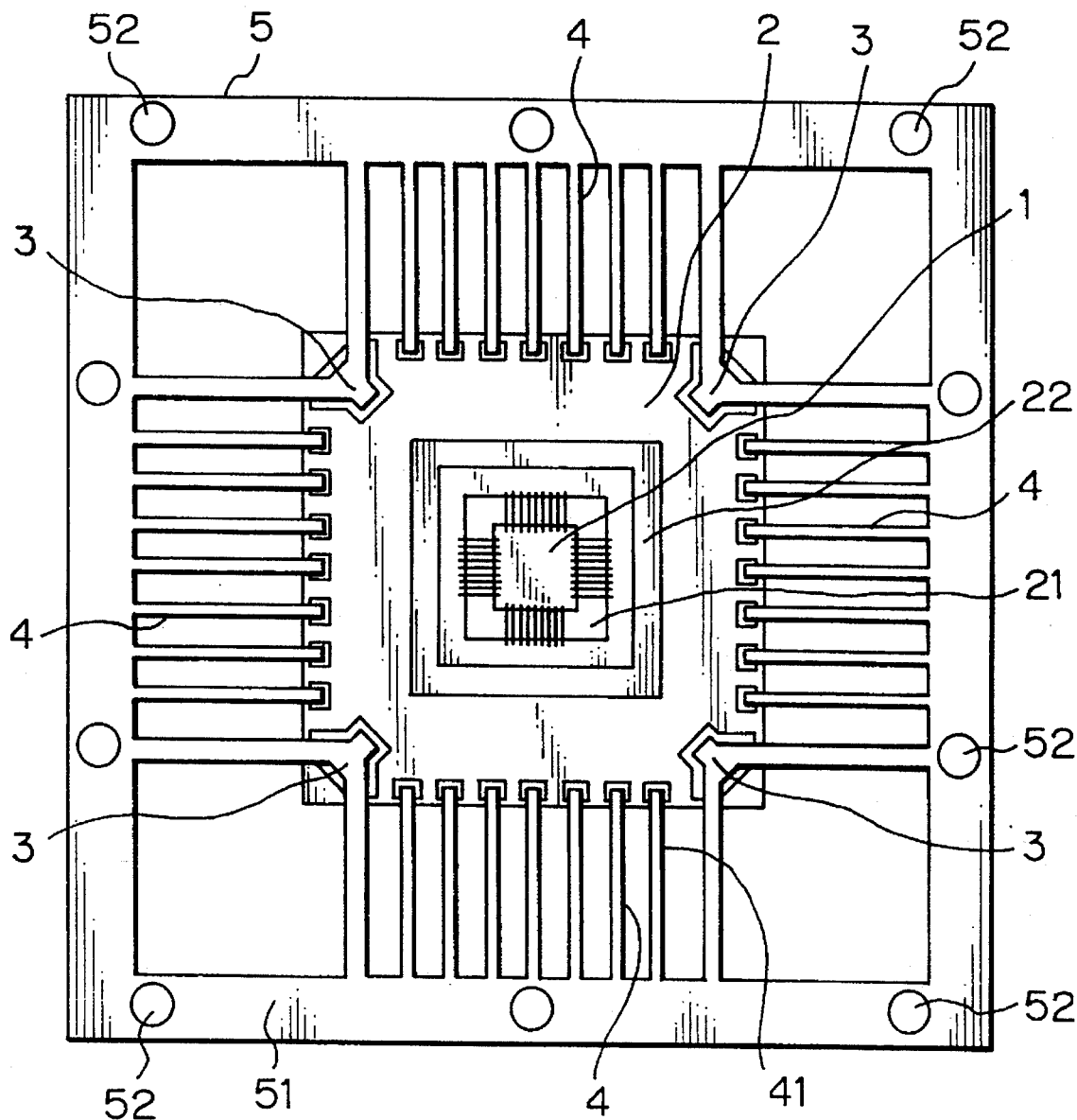
FIG. 1 is a plan view of a conventional flat package in a condition before hermetic sealing.

To better understand the present invention, a reference will be made to a conventional flat package for a semiconductor IC, shown in FIG. 1. The flat package is shown in a condition before hermetic sealing. As shown, the package is generally made up of a semiconductor chip 1, a substrate 2, and a lead frame 5. The substrate 2 is implemented as a ceramic or plastic laminate substrate including a wiring layer for electric connection, not shown. The substrate 2 has a cavity 21 and a seal metallized portion 22. The cavity 21, receiving the chip 1 therein, is metallized for conductivity. A metallic cap for hermetic sealing, not shown, is fitted on the seal metallized portion 22. The lead frame 5 has suspension leads 3 at four corners thereof for holding the substrate 2, leads 4 for connecting the package to external circuitry, and a tiebar or frame 51. Guide holes 52 are formed in the tiebar 51. After the leads 4 have been cut off from the tiebar 51, the electric characteristic of the IC is tested with the leads 4 held in their contact positions by the guide holes 52, as will be described specifically later. During this test, the suspension leads 3 additionally serve to hold the tiebar 51.

The IC is packaged and sealed by the following procedure. First, the chip 1 is bonded to the cavity 21 of the substrate 2 by conductive adhesive. Electrode pads, not shown, provided on the chip 1 are respectively connected to the leads 4 by metallic wires via the wiring layer of the substrate 2. Then, the metallic cap is soldered to the seal metallized portion 22, thereby hermetically sealing the chip 1. Subsequently, the leads 4 other than the suspension leads 3 are cut off from the tiebar 51. This is followed by the previously mentioned test for determining the electric characteristic of the IC. At this instant, the guide holes 52 of the tiebar 51 are respectively coupled over guide pins provided on a testing jig. Hence, the leads 4 are accurately connected to corresponding contacts also provided on the testing jig. If the IC is acceptable as determined by the test, the suspension leads 3 are cut off to remove the tiebar 51. Finally, the leads 4 are each trimmed to have a predetermined shape.

Figure 2A:
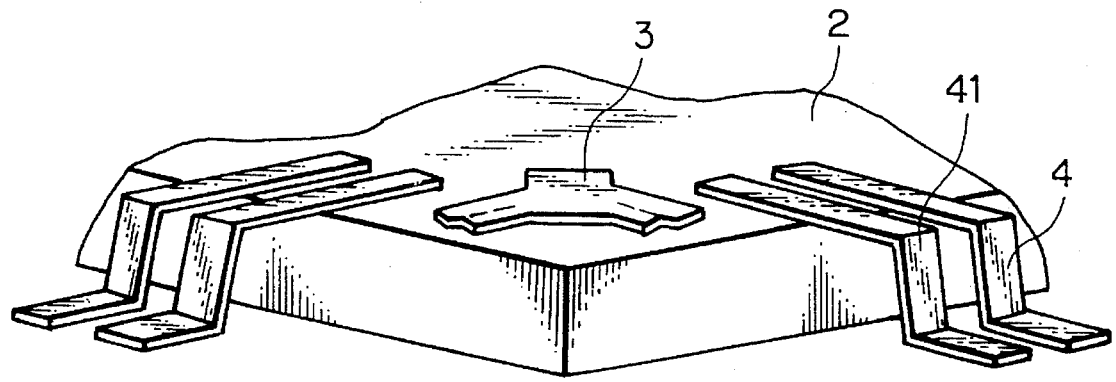
FIGS. 2A and 2B are fragmentary perspective views of the conventional flat package, particularly leads and suspension lead thereof, in a trimmed condition.
Figure 2B:
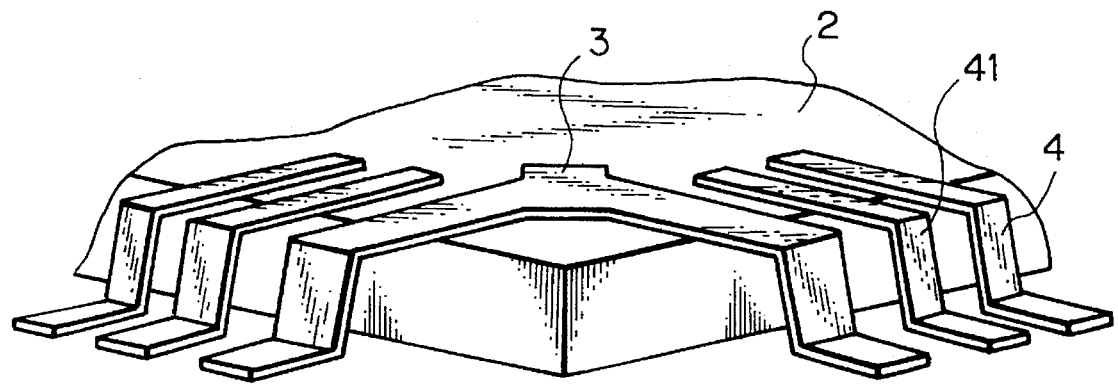

After the leads 4 have been trimmed, the suspension leads 3 appear as shown either in FIG. 2A or in FIG. 2B. As shown in FIG. 2A, the suspension leads 3 are usually removed and, therefore, make no contribution to the electrical connection of the IC to external circuitry. On the other hand, there has recently been proposed to leave the suspension leads 3 on the IC and solder or otherwise fix them to a circuit board, as shown in FIG. 2B. While the leads 3 of FIG. 2B physically protect the outermost leads 41 from extraneous stresses, they do not join in the electrical connection, either.

The flat package having the above configuration is extensively used in a logical circuit having a high degree of integration and needing high-speed performance. Preferably, therefore, the chip 1 should be shielded in order to be immune to external electromagnetic fields and to radiate no needless electromagnetic waves to the outside, i.e., to enhance the EMI characteristic. This has customarily been done by connecting the cavity 21 and seal metallized portion 22 to ground.

Specifically, to shield the chip 1, one or both of the cavity 21 and seal metallized portion 22 are respectively connected to, among the leads 4, the leads 4 preselected for this purpose by exclusive wirings. However, the problem is that the number of leads 4 is limited by the relation between the lead pitch and the dimensions of the substrate 2. Moreover, the exclusive leads 4 for shielding are not always guaranteed due to the required number of leads for electrical connection which is increasing to implement advanced functions. It is, therefore, a common practice to connect, within the substrate 2, one or both of the cavity 21 and shield metallized portion 22 to any one of ground wirings laid in the chip 1, depending on the user's desired specifications.

Generally, a plurality of ground wirings exist in the chip 1. This, coupled with the combination of the cavity 21 and seal metallized portion 22, results in a great number of combinations of internal ground connections using the internal wirings. Hence, when a plurality of users each desires different specifications as to the ground connection, the supplier must prepare a plurality of ICs which are identical in configuration except for the shield, but different in type.

As stated above, to connect the cavity 21 and seal metallized portion 22 to ground for the enhancement of EMI characteristic, it is necessary to connect each of them to an exclusive lead 4 by a respective wiring. This reduces the number of leads available for the connection of the IC to external circuitry. When the exclusive leads for grounding are not available, the cavity and seal metallized portion must be connected to a ground wiring within the chip. As a result, a plurality of ICs identical in function, but different in type, must be prepared in matching relation to the number of possible combinations of the internal connections.

On the other hand, Japanese Patent Laid-Open Publication No. 62-45156 discloses a package for a semiconductor device and having a lead frame including tab suspension leads. The lead frame electrically connects a semiconductor chip mounted on a ceramic package to the terminals of external circuitry. The chip is bonded to a tab also included in the lead frame by conductive adhesive while the tab is electrically connected to the tab suspension leads, thereby substantially connecting the chip to ground. This successfully connects the chip to ground for the shielding purpose without resorting to extra leads and thereby enhances the stable operation of the IC. However, because the lead frame having the tab is for use in a ceramic package which accommodates a small scale IC having a small number of leads, it is not directly applicable to the previously stated flat package.

Preferred embodiments of the flat package in accordance with the present invention will be described hereinafter. In the embodiments, the same or similar constituents as or to the constituents of FIGS. 1, 2A and 2B are designated by the same reference numerals, and a detailed description thereof will not be made in order to avoid redundancy.

Figure 3:
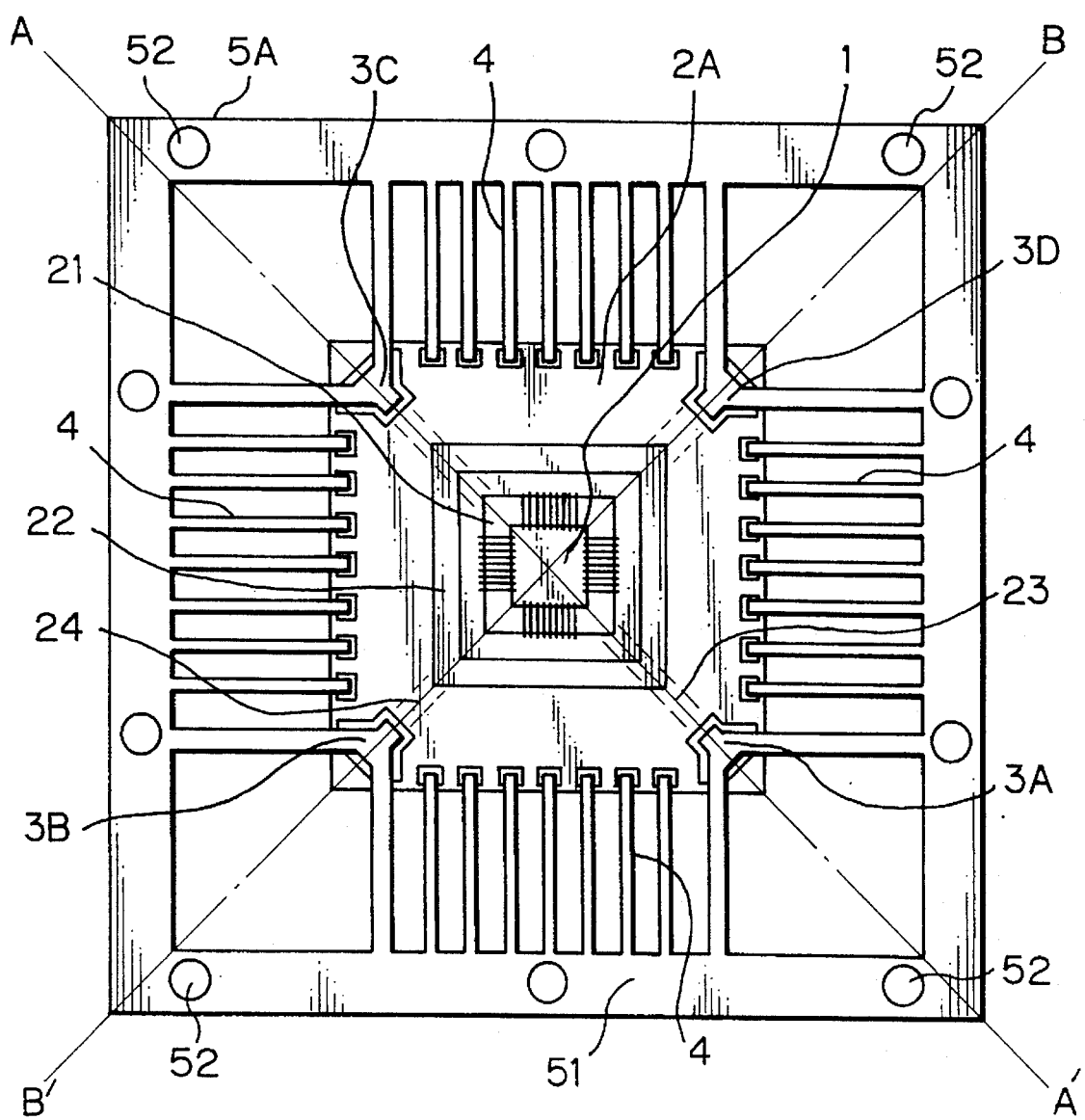
FIG. 3 is a plan view of a flat package embodying the present invention in a condition before hermetic sealing.

Referring to FIGS. 3, 3A and 3B, a flat package embodying the present invention is shown in a condition before hermetic sealing. As shown, the package has a semiconductor chip 1 common to the previously stated chip 1, a substrate 2A replacing the conventional substrate 2, and a lead frame 5A replacing the conventional lead frame 5. The substrate 2A additionally has internal wirings 23 and 24 respectively connecting a cavity 21 and a seal metallized portion 22 to external circuitry. The lead frame 5A includes suspension leads 3A 3C connected to the wiring 23 and suspension leads 3B and 3D respectively connected to the wirings 24.

In the illustrative embodiment, the package is designed such that when the distance between nearby leads 4 is 0.5 mm, the leads 4 are 0.2 mm wide each while the suspension leads 3A–3D are 0.5 mm wide each. The suspension leads 3A–3D, having a greater width than the leads 4, are capable of surely holding the leads 4 in the event of a selection test.

The flat package having the above configuration is sealed by the conventional procedure. Thereafter, the leads 4 other than the suspension leads 3A–3D are cut off from a tiebar 51. In this condition, the conventional electric characteristic test for selection is performed.

Figure 7:
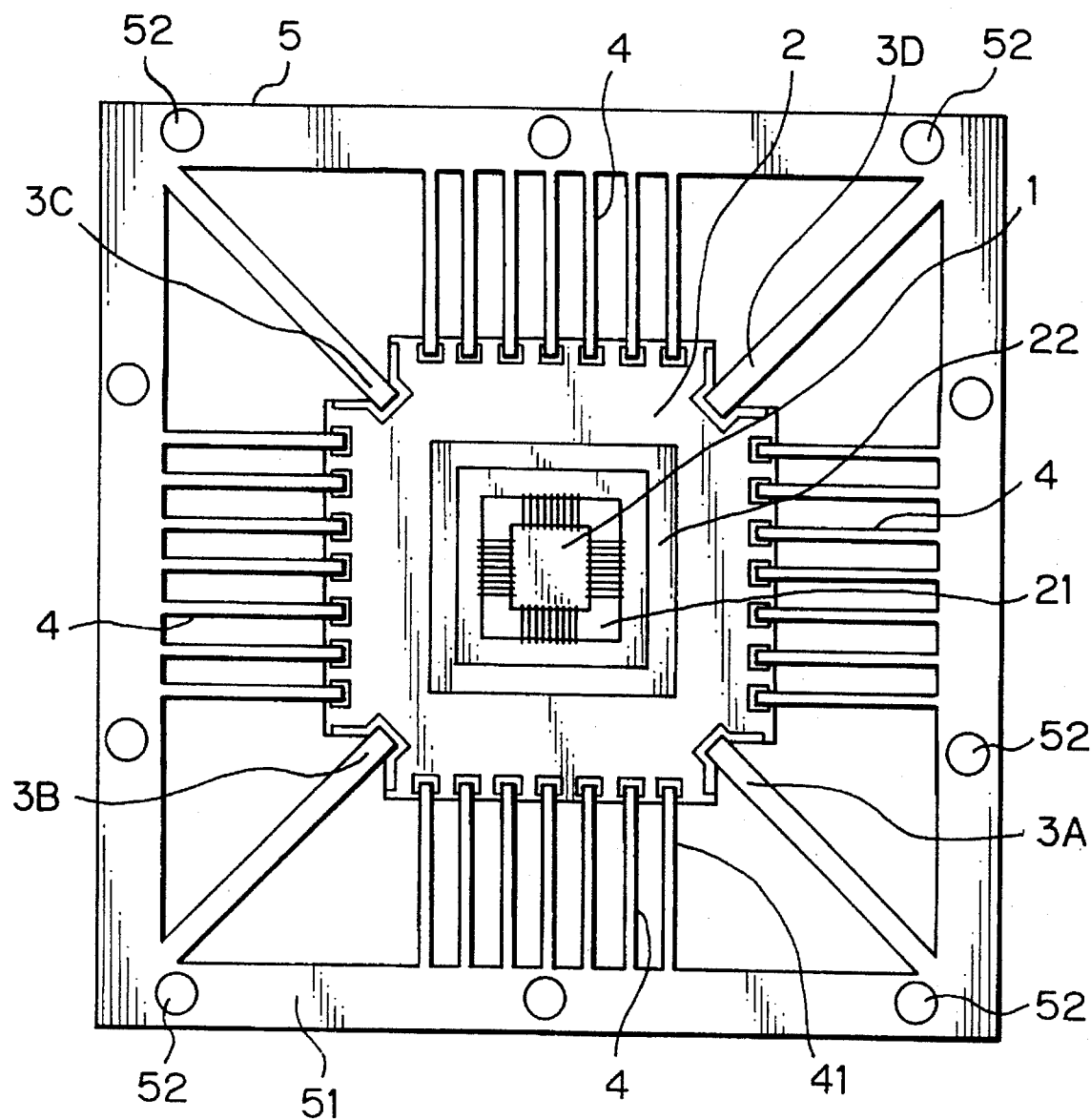
FIG. 7 is a plan view showing an alternative embodiment of the present invention in a condition before hermetic sealing.

It is to be noted that the suspension leads 3A–3D, serving to connect the package and tiebar 51 in the event of the test, may be configured as shown in FIG. 7. However, the previous embodiment is advantageous over this embodiment in that the leads 3A–3D of the former protect the outermost leads 4, which often receive the greatest signals, from deformation attributable to extraneous impacts more positively than the leads 3A–3D of the latter. This is because the leads 3A–3D of FIG. 3 each extends perpendicularly to the edge of the package.

The package, proved to be acceptable by the test, has its suspension leads 3A–3D cut off in the vicinity of the tiebar 51, so that the tiebar 51 is removed. Finally, the suspension leads 3A–3D are trimmed in the same manner as the leads 4.

Figure 4:
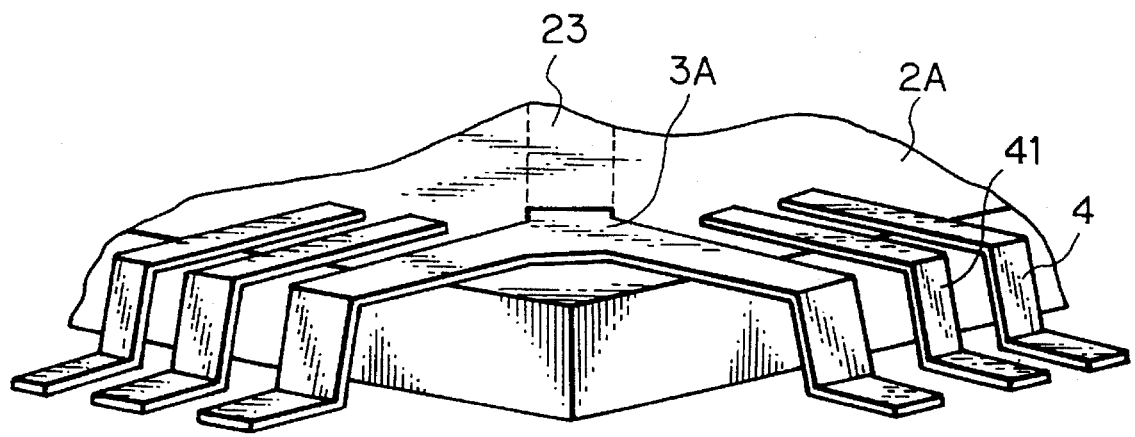
FIG. 4 is a fragmentary perspective view of the embodiment, particularly leads and suspension lead thereof, in a trimmed condition.

FIG. 4 shows the leads 4 and suspension lead 3A (3B, 3C or 3D) in a trimmed condition. As shown, the lead 3A physically protects the outermost leads 41 from extraneous stresses. In addition, the suspension lead 3A is connected to the internal wiring 23 connected to the cavity 21. Hence, by connecting the suspension lead 3A to ground, it is possible to connect the cavity 21 to ground. Likewise, by connecting the suspension leads 3B and 3D to ground, it is possible to connect the seal metallized portion 22 to ground via the internal wirings 24. Alternatively, the suspension leads 3A and 3C and/or the suspension leads 3B and 3D may be connected to a power supply assigned to the IC, because the grounding for shielding should only be implemented by a ground potential as to high frequency. In this manner, the IC can be optimally shielded on a circuit board by having one or both of the suspension leads 3A and 3C and the suspension leads 3B and 3D connected to ground or to a power supply assigned thereto.

Figure 5:
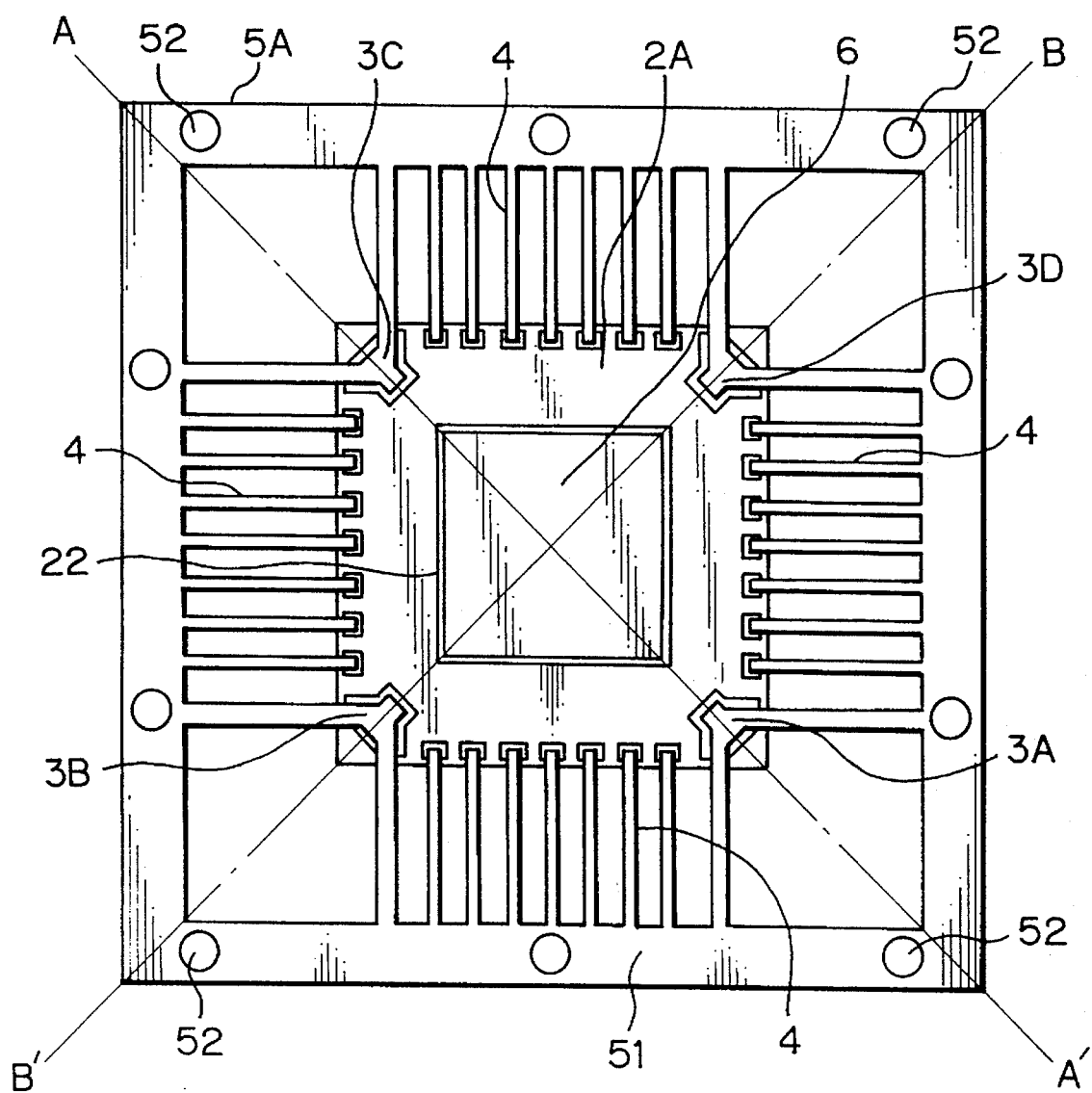
FIG. 5 is a plan view showing the embodiment in a hermetically sealed condition.
Figure 5A:
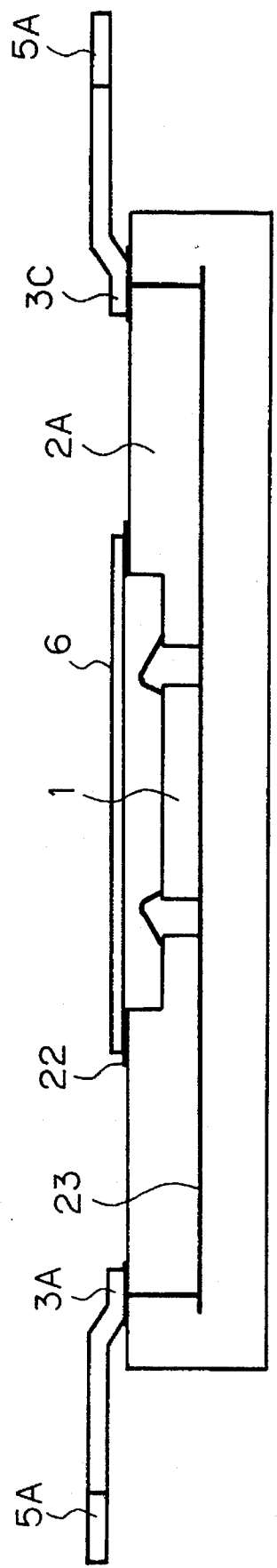
FIG. 5A is a section along line A–A' of FIG. 5.
Figure 6B:
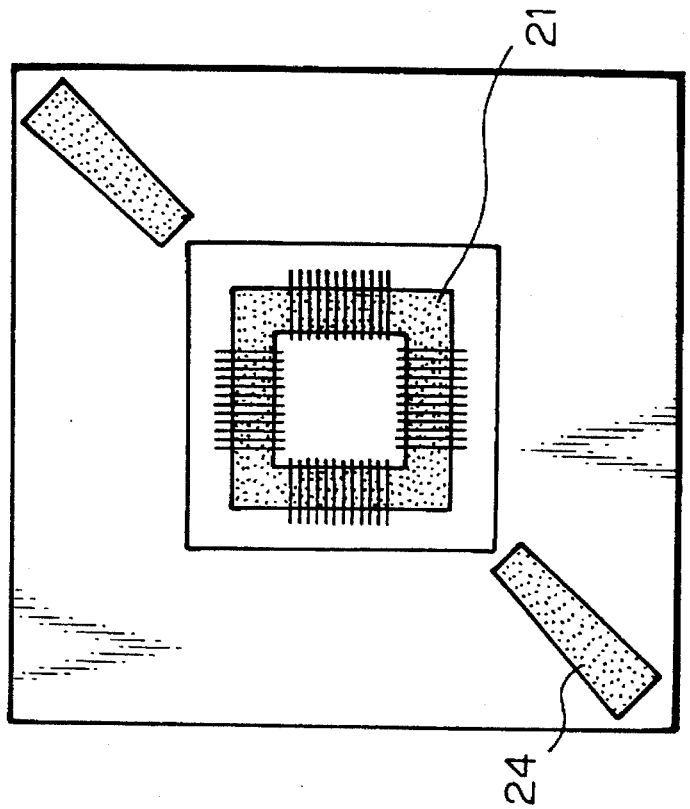
FIGS. 6A and 6B are plan views showing wiring layers included in the embodiment.
Figure 6A:
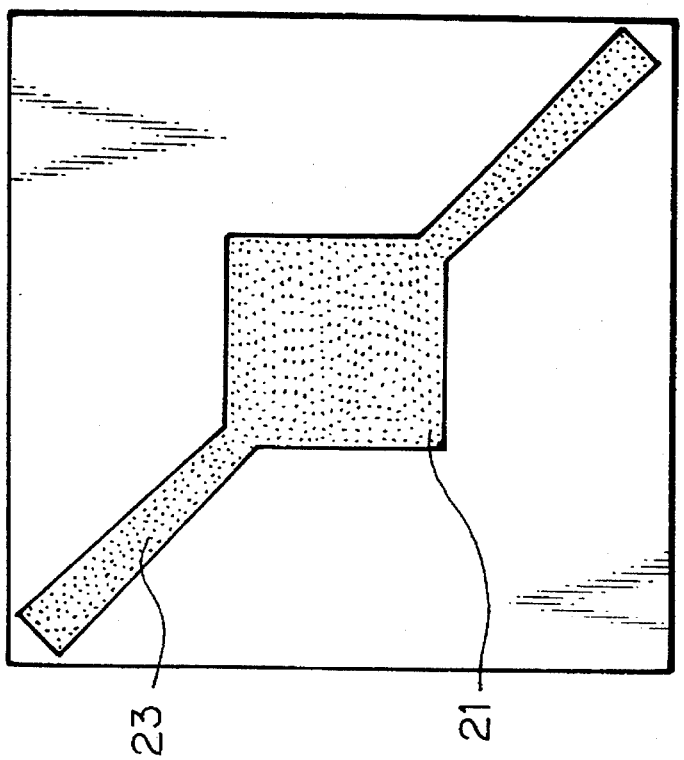

FIGS. 5 and 5A show the flat package of the embodiment in a hermetically sealed condition. The reference numeral 6 designates a cap. FIGS. 6A and 6B depict wiring layers laid in the package.

It is not necessary that all the suspension leads 3A–3D be connected to the cavity 21 and seal metallized portion 22, as shown in FIG. 3. For example, when only the cavity 21 should be connected to ground, it suffices to feed the ground potential via one of the leads 3A–3D. However, feeding the ground potential or the power source potential via all the four leads 3A–3D is more preferable from the stability standpoint.

Figure 8A:
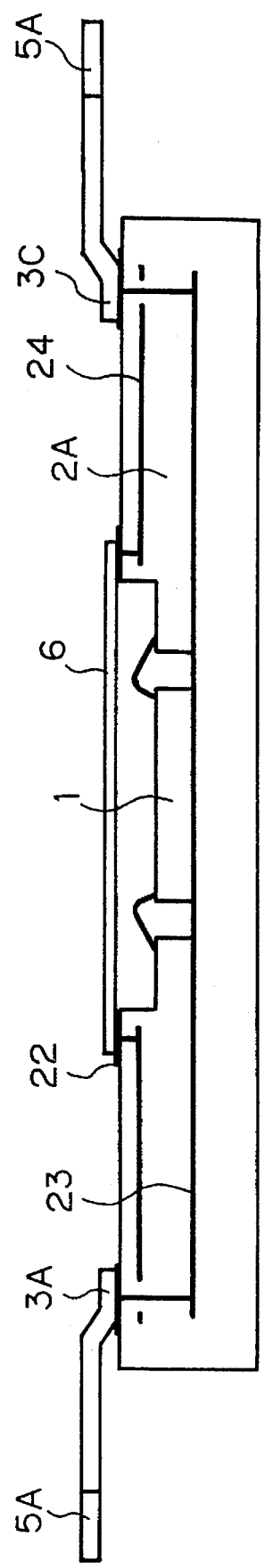
FIG. 8A is a section along line A–A' of FIG. 5, showing another alternative embodiment in a hermetically sealed condition.
Figure 8B:
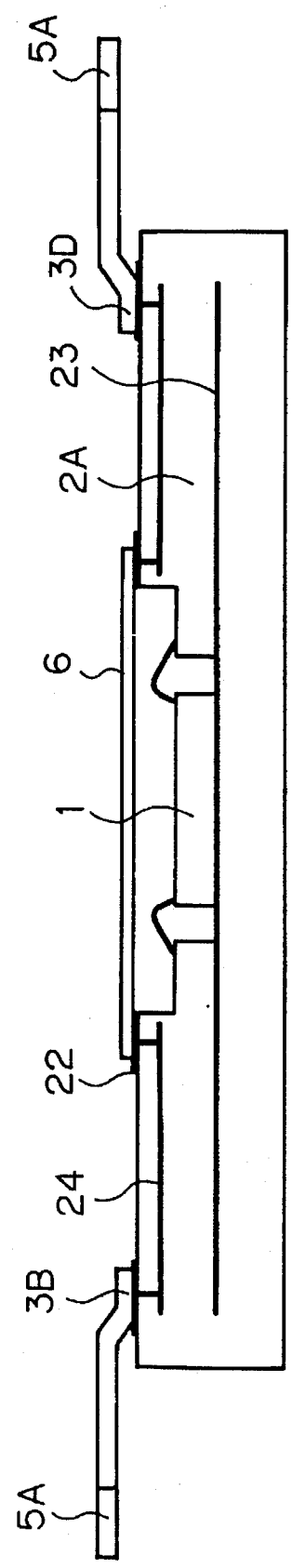
FIG. 8B is a section along line B–B' of FIG. 5, also showing the condition of FIG. 8A.
Figure 9B:
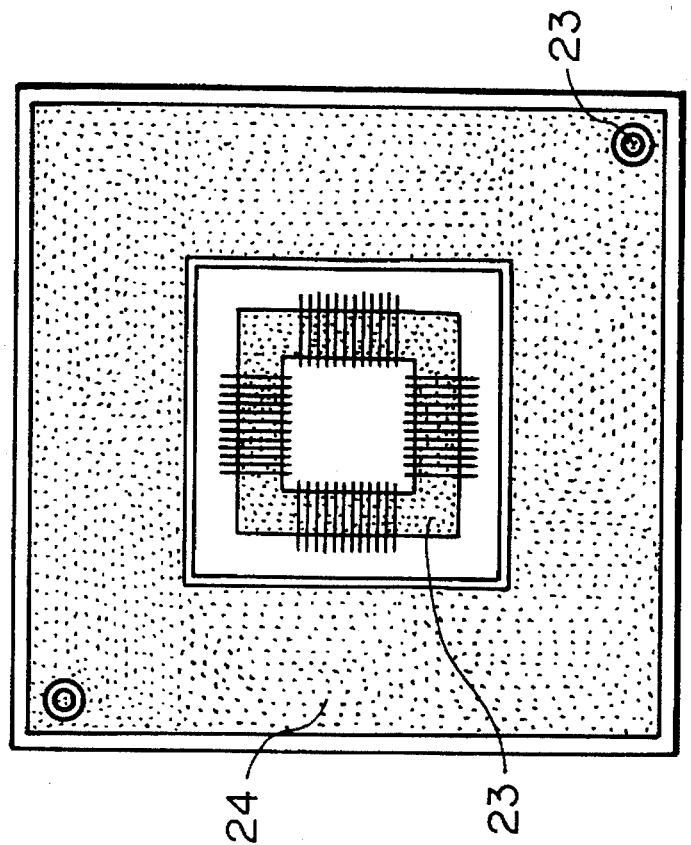
FIGS. 9A and 9B are plan views showing wiring layers included in the embodiment of FIGS. 8A and 8B.
Figure 9A:
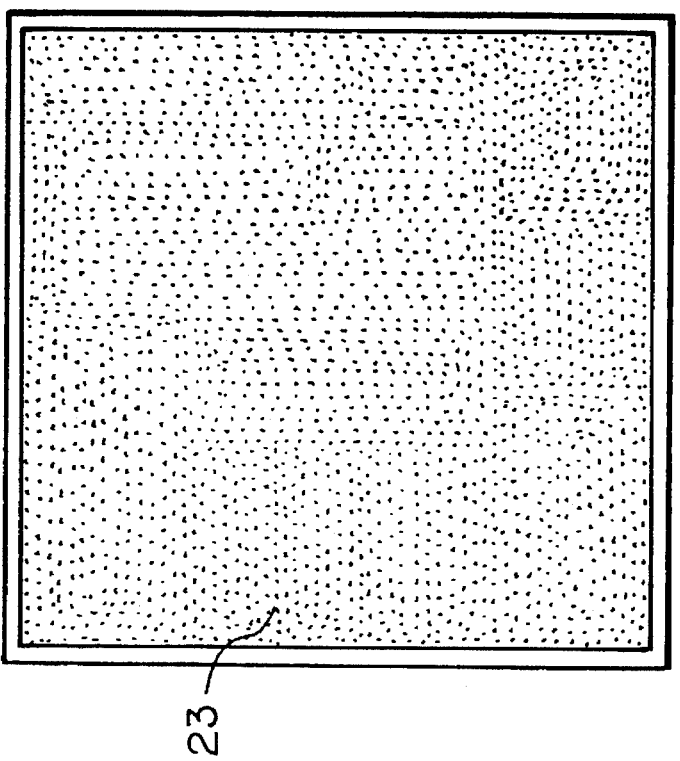

FIGS. 8A and 8B show another alternative embodiment of the present invention in a hermetically sealed condition. FIGS. 9A and 9B show internal wiring layers particular to this embodiment. As shown, the suspension leads 3A and 3C are connected to the cavity 21 by a plain wiring. Likewise, the suspension leads 3B and 3D are connected to the seal metallized portion 22 by a plain wiring. As a result, signal wirings laid in the package are also shielded. This further enhances the EMI characteristic, i.e., isolates the chip from external electromagnetic fields and causes no needless electromagnetic waves to be radiated to the outside.

In summary, in accordance with the present invention, a flat package includes a substrate having internal ground wirings respectively connecting a cavity and a seal metallized portion to respective suspension leads. The suspension leads are connected to ground for a shielding purpose. With this configuration, the package eliminates the need for exclusive ground leads which would limit the number of available valid leads. In addition, a single standard type of ICs can implement various shield configurations as desired by users.

Various modifications will become possible for those skilled in the art after receiving the teachings of the present disclosure without departing from the scope thereof.

What is claimed is:

1. A semiconductor device comprising:
    a package including:
        a substrate having first, second, third and fourth corner portions,
        first, second, third and fourth leads attached respectively to said first, second, third and fourth corner portions of said substrate,
        a first internal wiring buried in said substrate, said first internal wiring including a rectangular portion having first, second, third and fourth corners, a first portion extending from said first corner of said rectangular portion to said first corner portion of said substrate to electrically connect said rectangular portion to said first lead, and a second portion extending from said second corner of said rectangular portion to said second corner portion of said substrate to electrically connect said rectangular portion to said second lead,
        a cavity selectively formed in said substrate to expose a part of said rectangular portion of said first wiring,
        a metallized portion formed on said substrate along a periphery of said cavity to surround said cavity,
        a second internal wiring provided independently of said first internal wiring and extending from a part of said metallized portion to said third corner portion of said substrate to electrically connect said metallized portion to said third lead, and
        a third internal wiring provided independently of said first internal wiring and extending from another part of said metallized portion to said fourth corner portion of said substrate to electrically connect said metallized portion to said fourth lead;
    a semiconductor chip mounted on said part of said rectangular portion of said first internal wiring; and
    a cap attached to said metallized portion to seal said semiconductor chip.

2. The device as claimed in claim 1, wherein each of said first, second, third and fourth leads is applied with one of a power supply voltage and a ground voltage.

3. The device as claimed in claim 1, wherein each of said first and second leads is applied with one of a power supply voltage and a ground voltage and each of said third and fourth leads is applied with the other of said power supply voltage and said ground voltage.

4. The device as claimed in claim 1, wherein said first and second portions of said first internal wiring are arranged in line along a diagonal passing through said first and second corners of said rectangular portion of said first internal wiring and said second and third internal wirings are arranged in line along a diagonal passing through said third and fourth corners of said rectangular portion of said first internal wiring.

5. A semiconductor device comprising:
    a package including:
        a substrate,
        a first lead, a second lead and a plurality of third leads attached on said substrate,
        a first internal wiring buried in said substrate, said first internal wiring having a first portion provided in a center portion of said substrate and a second portion extending from said first portion to said first lead to form an electrical path therebetween,
        a plurality of second internal wirings formed in said substrate and each having first and second end portions, the first end portion of each of said second internal wirings being connected to an associated one of said third leads,
        a cavity selectively formed in said substrate to expose a part of said first portion of said first internal wiring and respective second end portions of said second internal wirings,
        a metallized portion formed on said substrate along a periphery of said cavity to surround said cavity, and
        a third internal wiring provided independently of said first internal wiring and said second internal wirings to electrically connect said metallized portion to said second lead;
    a semiconductor chip mounted on said part of said first portion of said first internal wiring and having a plurality of electrodes each electrically connected to an associated one of the second end portions of said second internal wirings; and
    a cap attached to said metallized portion to seal said semiconductor chip.

6. The device as claimed in claim 5, wherein each of said first and second leads is applied with one of a power supply voltage and a ground voltage.

7. The device as claimed in claim 5, wherein said first lead is applied with one of a power supply voltage and a ground voltage, and said second lead is applied with the other of said power supply and said ground voltage.

* * * * *